(12) United States Patent
Chee

(10) Patent No.: US 7,872,514 B2
(45) Date of Patent: Jan. 18, 2011

(54) LATCH CIRCUIT AND CLOCK SIGNAL DIVIDING CIRCUIT

(75) Inventor: Chong Hin Chee, Penang (MY)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 12/340,659

(22) Filed: Dec. 20, 2008

(65) Prior Publication Data

US 2010/0156495 A1    Jun. 24, 2010

(51) Int. Cl.
 *H03K 3/356* (2006.01)
(52) U.S. Cl. .................. 327/218; 327/208; 327/211; 327/212; 326/95; 326/98
(58) Field of Classification Search ......... 327/199–226; 326/93–38
See application file for complete search history.

(56) References Cited

U.S. PATENT DOCUMENTS

| 5,498,988 | A  | * | 3/1996  | Reyes et al. ................ | 327/199 |
| 6,192,225 | B1 |   | 2/2001  | Arpaia                       |         |
| 6,822,478 | B2 | * | 11/2004 | Elappuparackal ............. | 326/46  |
| 7,405,606 | B2 | * | 7/2008  | Kok et al. .................. | 327/202 |
| 7,772,905 | B2 | * | 8/2010  | Yasuda et al. ............... | 327/202 |
| 7,782,108 | B2 | * | 8/2010  | Sedlak ...................... | 327/211 |

OTHER PUBLICATIONS

Moisiadis, et al. Differential CMOS Edge-Triggered Flip-Flop Based on Clock Racing; Electronics Letters; vol. 36, Issue 12, Jun. 8, 2000; pp. 1012-1013.

Xia, et al. Differential CMOS Edge-Triggered Flip-Flop With Clock-Gating; Electronics Letters; vol. 38, Issue 1, Jan. 3, 2002; pp. 9-11.

Seyedi, et al. Low Power Leakage Clock Gated Static Pulsed Flip-Flop; ISCAS 2006, pp. 3658-3661.

Aguirre-Hernandez, et al. A Clock-Gated Pulse-Triggered D Flip-Flop for Low Power High-Performance VLSI Synchronous Systems; Proceedings of the 6th International Caribbean Conference on Devices, Circuits and Systems, Mexico, Apr. 26-28, 2006, pp. 293-297.

Yuan, et al. "High Speed CMOS Circuit Techniques" IEEE Journal of Solid State Circuits, vol. 24, No. 1, Feb. 1989.

* cited by examiner

*Primary Examiner*—Lincoln Donovan
*Assistant Examiner*—Patrick O'Neill
(74) *Attorney, Agent, or Firm*—Anthony P. Curtis

(57) ABSTRACT

Latch circuit and clock signal dividing circuit comprises sequentially connected latch circuits. Each latch circuit has D-type latch with latch clock input, data input and data output. A difference detector is coupled to D-type latch, and has a difference output that provides a difference signal when data at input is different than data at output. Each latch circuit has an edge triggered gate that has gate clock input, output coupled to latch clock input and gate control input coupled to difference output of difference detector. In operation, when both a transition of clock signal supplied at gate clock input is detected by edge triggered gate, and the difference signal is provided to gate control input, will edge triggered gate allow an edge of a clock signal supplied at gate clock input to determine logic values supplied to latch clock input. As a result, data at input is transferred to output.

18 Claims, 6 Drawing Sheets

LATCH CIRCUIT AND CLOCK SIGNAL DIVIDING CIRCUIT

FIELD OF THE INVENTION

The present invention relates generally to storage circuits, and more particularly, to latch circuits and clock signal dividing circuits.

BACKGROUND OF THE INVENTION

Latch circuits are an essential building block for most digital circuits and are used in a variety of digital integrated circuits. For instance, gate arrays and standard cell libraries devote large numbers of their cells to latch circuit designs. Furthermore, most latch circuits included in a library have minor variations, such as a scan input or set/reset options.

It is well known that the speed at which a digital circuit operates is determined by its worst case data path. Latch delays can be a large portion of the worst case delay due to their high proclivity of use in digital designs. Accordingly, by concentrating on reducing latch delays, it is possible to significantly increase speeds of digital systems.

Latches often form the basis of flip flops, such as a D-type flip flop. The D-type flip flop (as well as many other flip flop designs) is formed in two distinct sections called a master section and a slave section. The master section receives and stores data coupled to the flip flop input during one phase of the clock cycle. The data is shifted from the master section to the slave section during the other phase of the clock cycle. The slave section stores and provides the data at the flip flop outputs. Such flip-flops are implemented with a relatively large amount of gates, and therefore use relatively large amounts of power especially at high frequencies.

The power consumption of flip flops in frequency dividers operating at high frequencies can be undesirable. This power consumption occurs mainly as a result of the numerous transistors switching on or off during every clock cycle. Accordingly, latch circuits that selectively clock data only when new data has been detected at their inputs have been developed. However, such latch circuits use delay circuitry in the clock signal path to create phase shifted or delayed clock signals that can lead to undesirable power consumption.

BRIEF DESCRIPTION OF THE DRAWINGS

In order that the invention may be readily understood and put into practical effect, reference will now be made to exemplary embodiments as illustrated with reference to the accompanying figures, wherein like reference numbers refer to identical or functionally similar elements throughout the separate views. The figures together with a detailed description below, are incorporated in and form part of the specification, and serve to further illustrate the embodiments and explain various principles and advantages, in accordance with the present invention, where.

Figure 1:
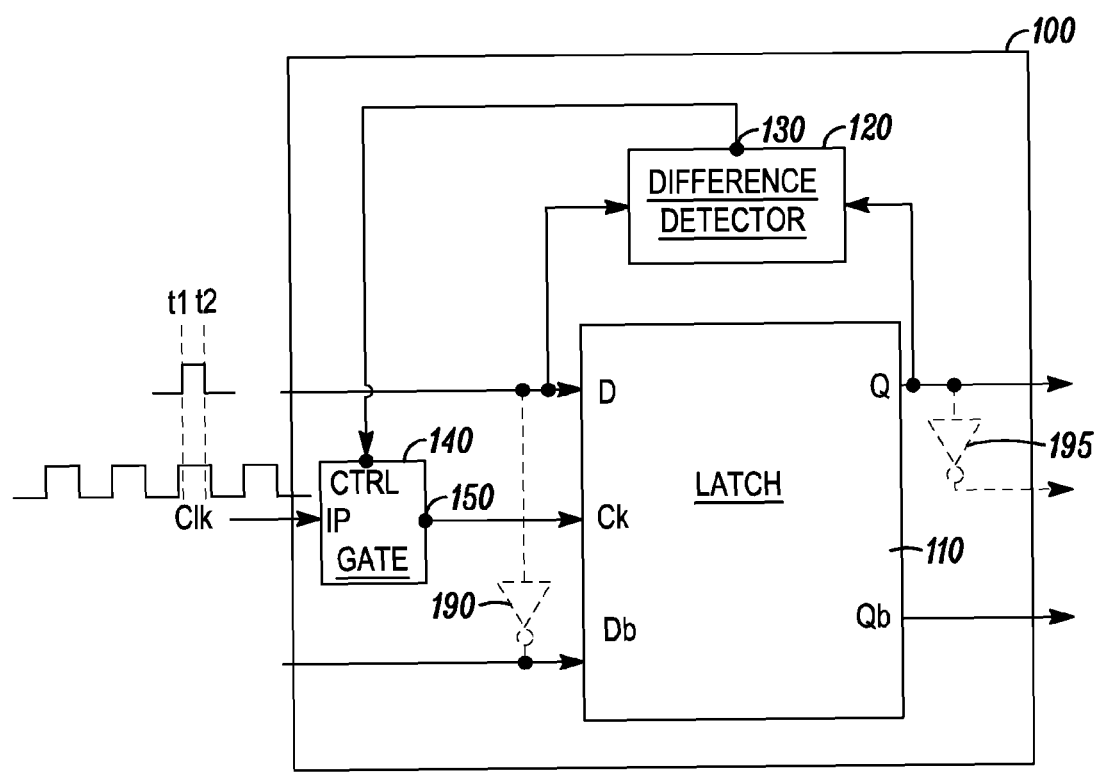
FIG. 1 is a schematic block diagram illustrating a latch circuit in accordance with an embodiment of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in circuit components. Accordingly, the circuit components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. Also, throughout this specification, gate, gate input and control electrode can be used interchangeable. The terms "comprises," "comprising," or any other variation thereof, are intended to cover a non-exclusive inclusion, such that device components that comprises a list of elements does not include only those elements but may include other elements not expressly listed or inherent to such a circuit component. An element proceeded by "comprises . . . a" does not, without more constraints, preclude the existence of additional identical elements in the circuit that comprises the element.

According to one aspect of the disclosure, there is provided a latch circuit comprising a D-type latch with a latch clock input, a data input and a corresponding data output. There is a difference detector coupled to the D-type latch, the difference detector having a difference output that provides a difference signal when data at the data input is different than data at the corresponding data output. The latch circuit has a gate having a gate clock input, an output coupled to the latch clock input and gate control input coupled to the difference output of the difference detector. When the difference signal is provided to the gate control input, the gate allows a clock signal supplied at the gate clock input to determine logic values supplied to the latch clock input thereby resulting in the data at the data input being transferred to the data output. Only after the data at the data input is transferred to the corresponding data output will the gate disallow the clock signal from determining the logic values supplied to the latch clock input.

According to another aspect of the disclosure, there is provided a latch circuit comprising D-type latch with a latch clock input, a data input and a corresponding data output. A difference detector is coupled to the D-type latch, the difference detector having a difference output that provides a difference signal when data at the data input is different than data at the corresponding data output. The latch circuit has an edge triggered gate that has a gate clock input, an output coupled to the latch clock input and a gate control input coupled to the difference output of the difference detector. In operation, only when both a transition of the clock signal supplied at the gate clock input is detected by the edge triggered gate and the difference signal is provided to the gate control input, will the edge triggered gate allow an edge of a clock signal supplied at the gate clock input to determine logic values supplied to the latch clock input. As a result, the data at the data input is transferred to the data output.

According to another aspect of the disclosure, there is provided a clock signal dividing circuit comprising sequentially connected latch circuits. Each of the latch circuits has a D-type latch with a latch clock input, a data input and a corresponding data output. A difference detector is coupled to the D-type latch, the difference detector having a difference output that provides a difference signal when data at the data input is different than data at the corresponding data output. Each of the latch circuits has an edge triggered gate that has a gate clock input, an output coupled to the latch clock input and a gate control input coupled to the difference output of the difference detector. In operation, only when both a transition of the clock signal supplied at the gate clock input is detected by the edge triggered gate and the difference signal is provided to the gate control input, will the edge triggered gate allow an edge of a clock signal supplied at the gate clock input to determine logic values supplied to the latch clock input. As a result, the data at the data input is transferred to the data output.

Referring to FIG. 1, there is illustrated a schematic block diagram of a latch circuit 100 comprising a D-type latch 110 with a latch clock input (Ck), a data input (D), a corresponding data output (Q) corresponding to the data input (D), a complementary data input (Db) and a complementary data output (Qb) corresponding to the complementary data input (Db). The complementary data input (Db) can be a unique external input to the latch circuit or as shown in phantom the complementary data input (Db) may be simply tapped off from the data input (D) using an inverter 190. Also, the complementary data output (Qb) can be a unique external output or as shown in phantom the complementary data output (Qb) may be tapped off from the data output (Q) using an inverter 195. The latch circuit 100 has a difference detector 120 coupled to the D-type latch 110 in which the difference detector 120 has two inputs, one of which is coupled to the data input (D) and the other is coupled to corresponding data output (Q). It will be noted that the inputs of the difference detector 120 could be coupled to the complementary data input (Db) and complementary data output (Qb) instead of the data input (D) and corresponding data output (Q).

The difference detector 120 has a difference output 130 that provides a difference signal (DS) when data at the data input (D) is different to data at the corresponding data output (Q). The latch circuit 100 also has a gate 140 having a gate clock input (IP), an output 150 coupled to the latch clock input (Ck) and gate control input (CTRL) coupled to the difference output 130 of the difference detector 120. In operation, when the difference signal (DS) is provided to the gate control input (CTRL), the gate 140 allows a clock signal (Clk) supplied at the gate clock input (IP) to determine the logic values at latch clock input (Ck), thereby resulting in the data at the data input (D) being transferred to the data output (Q).

Only after the data at the data input (D) is transferred (clocked) to the corresponding data output (Q) will the gate 140 disallow the clock signal (Clk) from determining the logic values supplied to the latch clock input (Ck).

By way of example, assume that a logic level 1 is the difference signal (DS) that when detected at the gate control input (CTRL) controls the gate 140 to allow the clock signal (Clk) to control or determine the logic value at the output 150. When the data at the data input (D) is different to data at the corresponding data output (Q), the difference signal (DS) occurs (in this example a logic level 1 at a time t1) and the clock signal (Clk) determines the logic values supplied to the latch clock input (Ck) of D-type latch 110. As a result, data at the data input (D) is clocked to the corresponding data output (Q), and thus, the difference signal (D) is removed (in this example, a logic level 0 at time t2), and therefore, gate 140 will disallow the clock signal (Clk) from determining the logic values supplied to the latch clock input (Ck).

Figure 2:
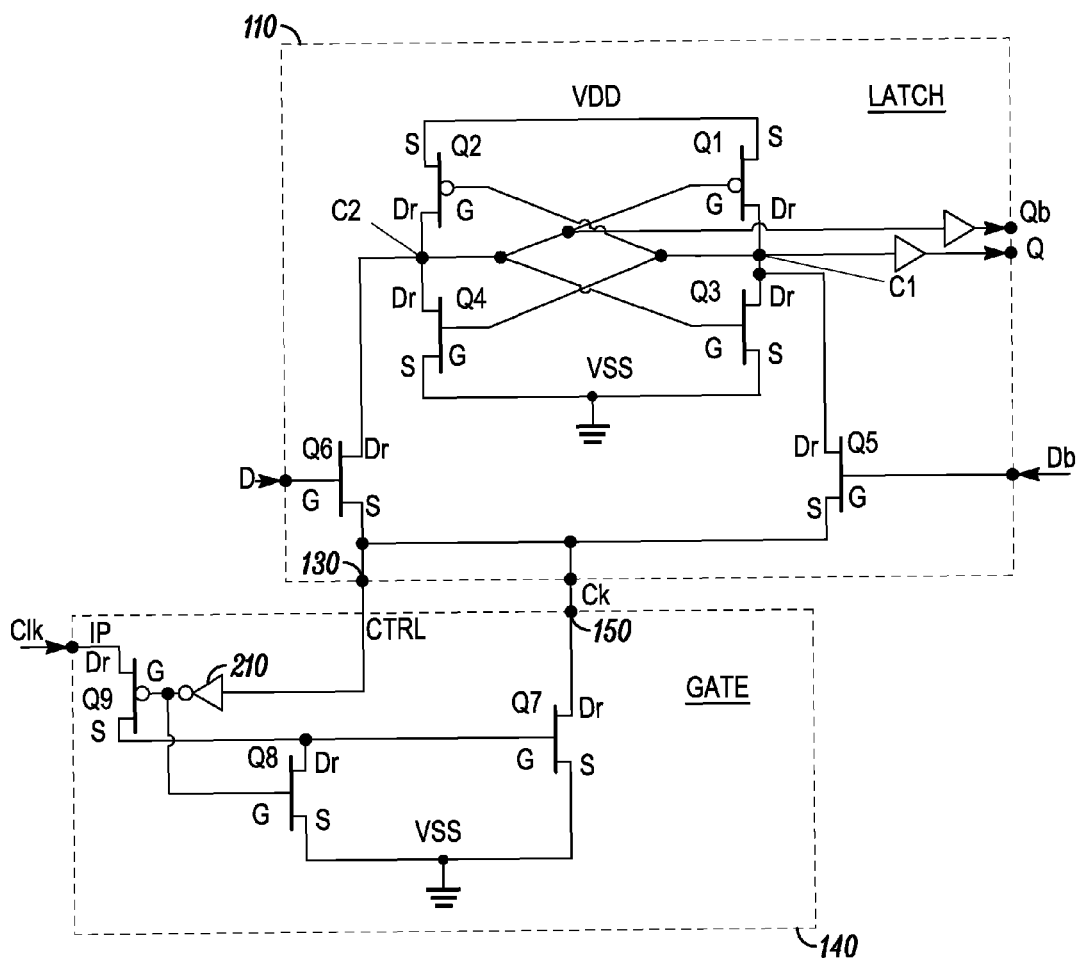
FIG. 2 is a schematic transistor level diagram illustrating a transistor level implementation of the latch circuit of FIG. 1 in accordance with an embodiment of the present invention.

Referring to FIG. 2 there is shown a schematic transistor level diagram illustrating a transistor level implementation 200 of the latch circuit 100. In this transistor level implementation 200, the D-type latch 110 comprises cross coupled inverters in which each of the cross coupled inverters comprises a pair of series coupled complementary transistors, one of the pair of series coupled complementary transistors includes a P-type transistor Q1 and an N-type transistor Q3. The other one of the pair of series coupled complementary transistors includes a P-type transistor Q2 and an N-type transistor Q4. Each pair of the series coupled complementary transistors has a respective common node C1, C2 that provides the corresponding data output (Q) corresponding to the data input (D) and the complementary data output (Qb) corresponding to the complementary data input (Db). Also, each common node C1, C2 is connected, through respective latch input transistors Q5, Q6 to the latch clock input Ck. It will be appreciated by a person skilled in the art that implementations, other than cross coupled inverters, for the D-type latch 110 may be possible, such as parasitic capacitors that can store charges on their electrodes.

As shown, one of the latch input transistors Q5 has a gate input (G) coupled to the data input (Db) and another one of the latch input transistors Q6 has a gate input (G) coupled to the complementary data input (D). The difference detector is provided by the latch input transistors Q5, Q6 and the difference output 130 is a node common to the latch clock input Ck. By way of example, when Q=0 and D=0, then difference output 130=Q=0; when Q=0 and D=1, then difference output 130=Qb=1; when Q=1 and D=0, then difference output 130=Q=1; and when Q=1 and D=1, then difference output 130=Qb=0. Hence, as will be apparent to a person skilled in the art, the difference detector 120 is an exclusive OR (XOR) circuit inherently provided by the latch input transistors Q5, Q6, and the difference output 130 is a node common to the latch clock input Ck. The difference output 130 is coupled to the gate control input (CTRL) of the gate 140, however, if an inverter is inserted at the difference output 130, then the difference detector would become an exclusive NOR (XNOR) circuit.

The gate 140 comprises a gate transistor Q9 selectively coupling the gate clock input (IP) to a control electrode or gate (G) of a clocking transistor Q7 that selectively couples the latch clock input Ck to ground (VSS). Also, the gate transistor Q9 has a control electrode (G) coupled to the gate control input (CTRL) by an inverter 210, the inverter further couples the gate control input (CTRL) to an electrode of a discharge transistor Q8. The discharge transistor Q8 provides for selectively coupling the control electrode (G) of the clocking transistor Q7 to ground to thereby remove any stored charge on the control electrode (G) of the clocking transistor Q7.

It will be apparent to a person skilled in the art that the inverter 210 could re removed and the gate transistor Q9 (shown as a P-type) would then need to be an N-type transistor whereas the discharge transistor Q8 (shown as an N-type) would then need to be a P-type transistor. From the above, when different data appears at the data input (D) that is different from data at the corresponding data output (Q), the difference signal (DS) occurs, therefore the transistor Q9 is switched on and the clock signal (Clk) can then switch on the clocking transistor Q7 (N-type transistor). When the clocking transistor Q7 is switched on, the latch clock input (Ck) is coupled to ground and the data at the data input (D) and complementary data input (Db) are transferred (clocked) to their respective outputs (Q and Qb). Once the data is transferred to the (Q and Qb), then the inputs and outputs of the D-type latch are the same and thus the difference signal (DS) is no longer present. Consequently, the gate transistor Q9 is switched off and blocks the clock signal (Clk) from being applied to the control electrode (G) of the clocking transistor Q7. Under these conditions, the discharge transistor Q8 is switched on, thereby coupling and discharging a charge on the control electrode (G) of the clocking transistor Q7 to ground. Once the charge on the control electrode (G) of the clocking transistor Q7 is discharged, the clocking transistor Q7 is switched off, which decouples the latch clock input (Ck) from ground.

Figure 3:
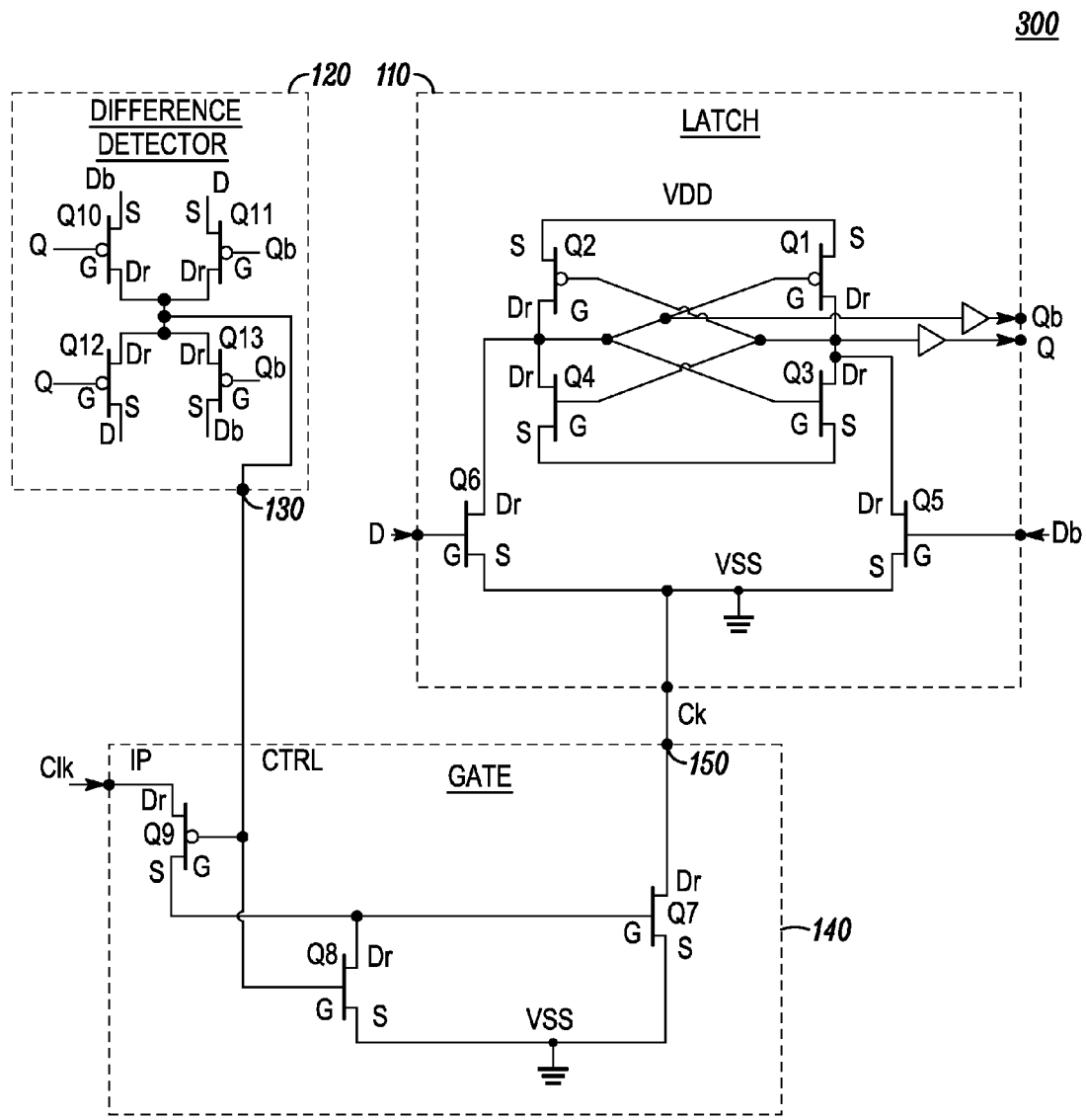
FIG. 3 is a schematic transistor level diagram illustrating another transistor level implementation of the latch circuit of FIG. 1 in accordance with an embodiment of the present invention.

Referring to FIG. 3, a schematic transistor level diagram illustrating another transistor level implementation 300 of the latch circuit 100 is shown. Again, in this transistor level implementation 300, the D-type latch 110 comprises cross coupled inverters in which each of the cross coupled inverters comprises a pair of series coupled complementary transistors, one of the pair of series coupled complementary transistors includes a P-type transistor Q1 and an N-type transistor Q3. The other one of the pair of series coupled complementary transistors includes a P-type transistor Q2 and an N-type transistor Q4. Each pair of the series coupled complementary transistors has a respective common node C1, C2 node that provides the corresponding data output (Q) corresponding to the data input (D) and a complementary data output (Qb) corresponding to the complementary data input (Db). Also, each common node C1, C2 is connected, through respective latch input transistors Q5, Q6 to the latch clock input Ck.

As shown, one of the latch input transistors Q5 has a gate input (G) coupled to the data input (Db) and another one of the latch input transistors Q6 has a gate input (G) coupled to the complementary data input (D). The difference detector is provided by complementary transistors Q11, Q13 and complementary transistors Q10, Q12 that are all coupled together, at their drain electrodes (Dr), to form the difference output 130. The source electrodes (S) of transistors Q11 and Q12 are coupled to the data input (D) and the source electrodes (S) of transistors Q10 and Q13 are coupled to the complementary data input (Db). The control electrodes (G) of complementary transistors Q11, Q13 are coupled to the complementary output (Qb), whereas the control electrodes (G) of complementary transistors Q10, Q12 are coupled to the output (Q).

In this embodiment, the difference detector is an exclusive NOR (XNOR) gate or circuit, and by insertion of an inverter could be converted to an exclusive OR (XOR) gate or circuit. The difference output 130 is coupled to the gate control input (CTRL) of the gate 140. Again, the gate 140 comprises a gate transistor Q9 selectively coupling the gate clock input (Clk) to a control electrode (G) of a clocking transistor Q7 that selectively couples the latch clock input Ck to ground. Also, the gate transistor Q9 has a control electrode (G) coupled to the gate control input (CTRL), the inverter further couples the gate control input (CTRL) to an electrode of a discharge transistor Q8. The discharge transistor Q8 provides for selectively coupling the control electrode (G) of the clocking transistor Q7 to ground to thereby remove any stored charge on the control electrode (G) of the gate transistor Q7.

The transistor level implementation 300 of the latch circuit 100 operates in the same way the transistor level implementation 200. Hence, the latch 110 is only clocked at the latch clock input (Ck) when there is a need to latch new data (data that is different from the previous data at the data input (D)). This can save power consumption as only new (different) data need to be clocked from the data input (D) to its complimentary output (Q). One issue with the above embodiments is that new data can be clocked immediately as it appears at the data input (D) to its complimentary output (Q) without the clock signal controlling when the data is to be clocked. For example, assume the clock signal (Clk) has a period of 10 ms (5 ms at logic 1, and 5 ms at logic 0), and the clock signal (Clk) has been at a logic 1 for 3 ms. Ideally, any new data should only be clocked after the clock signal (Clk) goes to logic 0 and returns to logic 1. However, as soon as the difference detector 120 detects the new data by providing the difference signal (DS), the new data is clocked immediately as it appears at the data input (D) to its complimentary output (Q). Hence, although the latch circuit 100 is useful, it may not be suitable for very high frequency clocked circuits and systems or circuits and systems that require data to be clocked to a data output at a time controlled by a clock transition.

Figure 4:
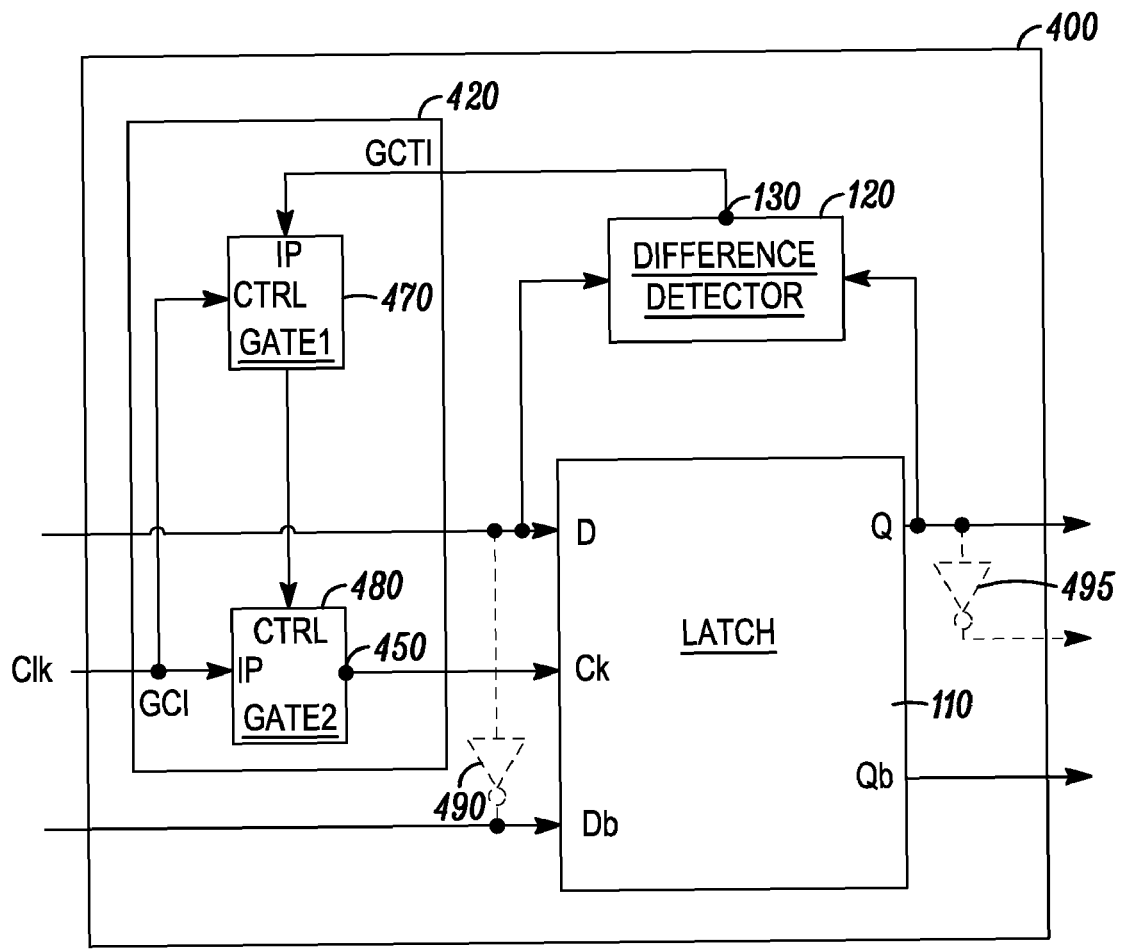
FIG. 4 is a schematic block diagram illustrating a latch circuit in accordance with an embodiment of the present invention.

Referring to FIG. 4, there is shown a schematic block diagram illustrating a latch circuit 400 of another embodiment of the present invention. The latch circuit 400 comprises the D-type latch 110 with a latch clock input (Ck), a data input (D), a corresponding data output (Q), a complementary data input (Db) and a complementary data output (Qb) corresponding to the complementary data input (Db). The complementary data input (Db) can be a unique external input to the latch circuit or as shown in phantom the complementary data input (Db) may be simply tapped off from the data input (D) using an inverter 490. Also, the complementary data output (Qb) can be a unique external output or as shown in phantom the complementary data output (Qb) may be tapped off from the data output (Q) using an inverter 495. The latch circuit 400 includes the difference detector 120 coupled to the D-type latch 110 in which the difference detector 120 has two inputs, one of which is coupled to the data input (D) and the other is coupled to corresponding data output (Q). Again, it will be noted that the inputs of the difference detector 120 could be coupled to the complementary data input (Db) and complementary data output (Qb) instead of the data input (D) and the corresponding data output (Q).

The difference detector 120 has a difference output 130 that provides a difference signal (DS) when data at the data input (D) is different than data at the corresponding data output (Q). The latch circuit 100 also has an edge triggered gate 420 that includes a first gate 470 (GATE 1) and a second gate 480 (GATE 2). The edge triggered gate 420 has a gate clock input (GCI), an output 450 coupled to the latch clock input (Ck) and a gate control input (GCTI) coupled to the difference output 130 of the difference detector 120. In operation, only when both a transition (rising or falling edge) of the clock signal supplied at the gate clock input (GCI) is detected by the edge triggered gate 420 and the difference signal (DS) is provided to the gate control input (GCTI) will the edge triggered gate 420 allow an edge of a clock signal (Clk) supplied at the gate clock input (GCI) to determine logic values to the latch clock input, as a result, the data at the data input (D) is transferred to the data output (Q).

Figure 5:
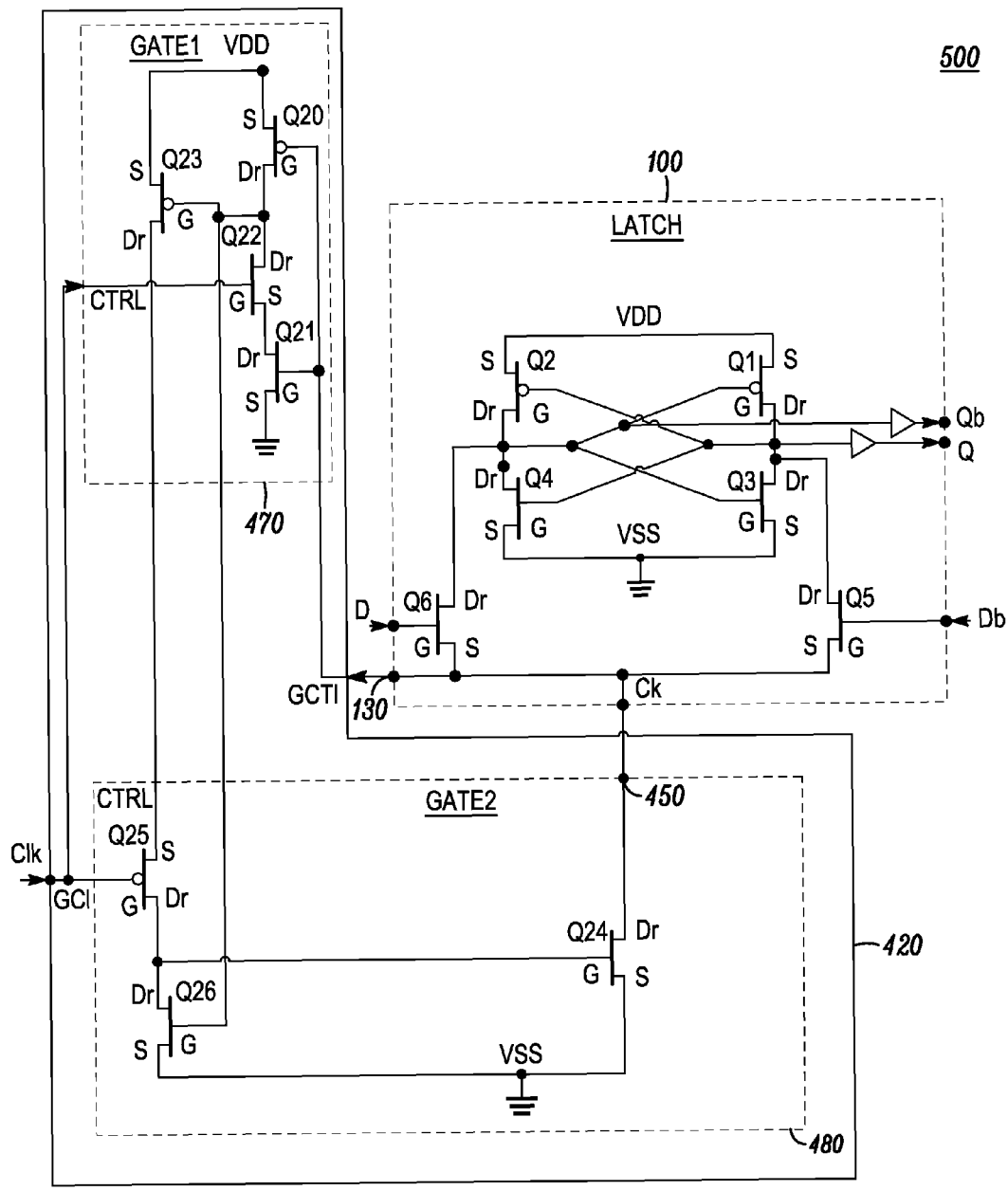
FIG. 5 a schematic transistor level diagram illustrating a transistor level implementation of the latch circuit of FIG. 4 in accordance with an embodiment of the present invention.

Referring to FIG. 5, there is shown a schematic transistor level diagram illustrating a transistor level implementation 500 of the latch circuit 400. Again, in this transistor level implementation 500, the D-type latch 110 comprises cross coupled inverters in which each of the cross coupled inverters comprises a pair of series coupled complementary transistors, one of the pair of series coupled complementary transistors includes a P-type transistor Q1 and an N-type transistor Q3. The other one of the pair of series coupled complementary transistors includes a P-type transistor Q2 and an N-type transistor Q4. Each pair of the series coupled complementary transistors has a respective common node C1, C2 node that provides the corresponding data output (Q) corresponding to the data input (D) and a complementary data output (Qb) corresponding to the complementary data input (Db). Also, each common node C1, C2 is connected, through respective latch input transistors Q5, Q6 to the latch clock input Ck.

As shown, one of the latch input transistors Q5 has a gate input (G) coupled to the data input (Db) and another one of the latch input transistors Q6 has a gate input (G) coupled to the complementary data input (D). The difference detector is an exclusive OR (XOR) circuit inherently provided by the latch input transistors Q5, Q6, and the difference output 130 is a node common to the latch clock input Ck. The difference output 130 is coupled to the gate control input (GTRI) of the edge triggered gate 420. As will be apparent to a person skilled in art, the difference detector 120 could be provided by dedicated transistors, such as illustrated in the embodiment of FIG. 2, in which the difference detector 120 could either provide and exclusive OR (XOR) function or an exclusive NOR (XNOR) function.

As illustrated, the second gate 280 of the edge triggered gate 420 comprises a clocking transistor Q24 (N-type transistor) and a gate transistor Q25 (P-type transistor) selectively coupling the gate clock input GCI to a control electrode (G) of the clocking transistor Q24 that selectively couples the latch clock input (Ck) to ground. Also, the second gate 280 has a discharge transistor Q26 (N-type transistor) selectively coupling the control electrode (G) of a clocking transistor Q24 to ground (VSS).

The first gate 470 of the edge triggered gate 420 comprises a pair of series connected complementary transistors Q20, Q21 selectively coupled at their drain electrodes (Dr) by a blocking transistor Q22 (N-type transistor). The pair of series connected complementary transistors Q20, Q21 have gate electrodes (G) coupled to the gate control input (GCTI) and the source electrode (S) of the transistor Q20 (P-type transistor) is coupled to a supply voltage VDD, whereas the source electrode (S) of the transistor Q21 (N-type transistor) is coupled to ground. The blocking transistor Q22 has a gate electrode (G) coupled to the gate clock input (GCI). The first gate 470 of the edge triggered gate 420 also has a triggering transistor Q23 (N-type transistor) with a drain electrode (Dr) coupled, at a control input (CTRL) of the first gate 470, to the source electrode (S) of the gate transistor Q25. The triggering transistor Q23 has a source electrode (S) coupled to VDD and a control electrode (G) coupled to the drain electrode (Dr) of blocking transistor Q20 and the control electrode (G) of the discharge transistor Q26.

In operation, before the difference signal (DS) is provided to the gate control input (GCTI), the logic level at gate control input (GCTI) will be at logic level 1 and the transistor Q20 is therefore switched on and transistor Q21 is switched off. The gate (G) of the triggering transistor Q23 will therefore be coupled to the supply voltage VDD, and thus, the triggering transistor Q23 will be switched off thereby blocking the supply VDD to the gate transistor Q25. In this state, the clocking transistor Q24 can never be switched on. When different data appears at the data input (D) that is different from data at the corresponding data output (Q), the difference signal (DS) at the difference output 130 is provided (logic level 1) to the gate control input (GCTI). In response to the difference signal (DS), the transistor Q20 is switched off and transistor Q21 is switched on, thereby removing VDD from the gate (G) of the triggering transistor Q23. However, a charge will remain at the gate (G) of triggering transistor Q23 until blocking transistor Q22 is switched on. Assuming the clock signal (Clk) is high (logic level 1), then blocking transistor Q22 will be switched on and the charge on the gate (G) of triggering transistor Q23 will be discharged to ground through the blocking transistor Q22 and transistor Q21. Triggering transistor Q23 will therefore be switched on. Furthermore, when the clock signal (Clk) goes low (logic level 0), the gate transistor Q25 is switched on and the supply voltage (VDD) will be supplied to the gate (G) of the clocking transistor Q24 through triggering transistor Q23 and gate transistor Q25.

When the clocking transistor Q24 is switched on, the latch clock input (Ck) is coupled to ground and the data at the data input (D) and complementary data input (Db) are transferred (latched) to their respective outputs (Q and Qb). Once the data is transferred to the respective outputs (Q and Qb), then the inputs and outputs of the D-type latch are the same, and thus, the difference signal (DS) is no longer present and the difference output 130 is at a logic level 0. Consequently, transistor Q20 is switched off and transistor Q21 is switched on, and again, the gate (G) of the triggering transistor Q23 will therefore be coupled to the supply voltage VDD. In this state, the triggering transistor Q23 will be switched off, thereby blocking the supply VDD to the gate transistor Q25. In effect, the operation of the edge triggered gate 420 only allows the latch 110 to clock data on a falling (trailing) edge of the clock signal (Clk) when the difference signal is present, however, the edge triggered gate 420 could be modified by an inverter or inverters to operate on a rising (leading) edge of the clock signal.

Hence, the latch 110 is only clocked at the latch clock input (Ck) when there is a need to latch new data (that is different from the previous data at the data input (D). This can save power consumption as only new (different) data need to be clocked from the data input (D) to its complimentary output (Q). In this embodiment, after a difference signal (DS) occurs, the new data is only clocked on when an edge of the clock signal (Clk) is trailing or falling (or with a suitable inverter a rising clock edge can be used). Thus, the clock signal (Clk) controls when new data is clocked (latched) as it appears at the data input (D) to its complimentary output (Q).

Figure 6:
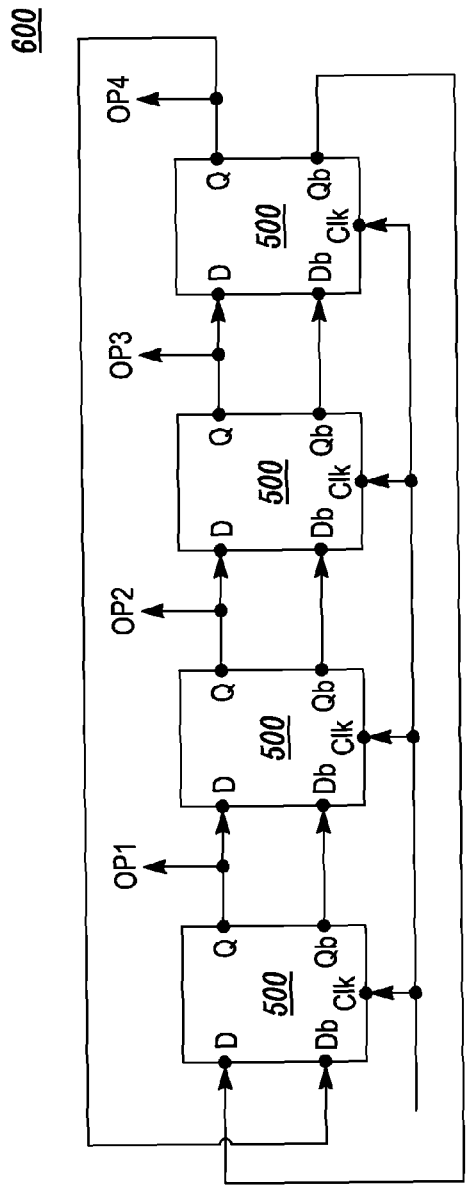
FIG. 6 is a block diagram of a clock dividing circuit comprising a plurality of sequentially connected latch circuits of FIG. 4 in accordance with an embodiment of the present invention.

Referring to FIG. 6, there is illustrated a block diagram of a clock signal dividing circuit 600 comprising a plurality of sequentially connected latch circuits 500 of FIG. 4 with outputs OP1,OP2,OP3,OP4. The data output (Q) of the most significant bit OP4 of the dividing circuit 600 is fed back to the data input (Db) of the least significant bit of the clock signal dividing circuit 600. Also, the complementary data output (Qb) of the most significant bit of the dividing circuit 600 is fed back to the data input (D) of the least significant bit of the clock signal dividing circuit 600.

Figure 7:
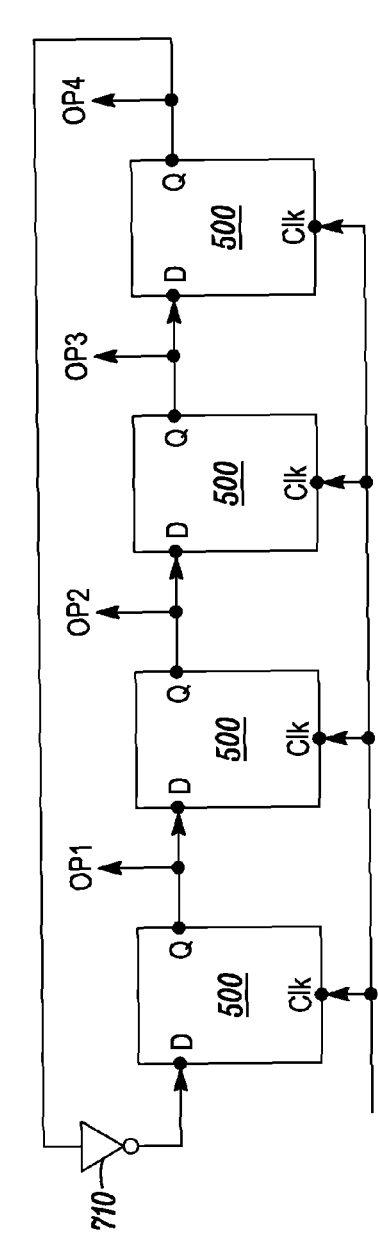
FIG. 7 is a block diagram of a clock dividing circuit comprising a plurality of sequentially connected latch circuits of FIG. 4 in accordance with an embodiment of the present invention.

Referring to FIG. 7, there is illustrated a block diagram of a clock signal dividing circuit 700 comprising a plurality of sequentially connected latch circuits 500 of FIG. 4 with outputs OP1,OP2,OP3,OP4. The sequentially connected latch circuits 500 are modified so that there is no external complementary data input (Db) or complementary data output (Qb). In this regard, the complementary data input (Db) is tapped off internally from the data input (D) using an inverter. The data output (Q) of the most significant bit OP4 of the dividing circuit 700 is fed back to the data input (D) through an inverter 710 of the least significant bit of the clock signal dividing circuit 700

Advantageously, the present invention alleviates the need for delay circuitry in the clock signal path to provide phase shifted or delayed clock signals. Accordingly, the present invention alleviates unnecessary power consumption caused by latching of new data which is identical to previously latched data or by using phase shifted or delayed clock signals.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention. The benefits, advantages, solutions to problems, and any elements that may cause any benefit, advantage, or solution to occur or become more pronounced are not to be construed as critical, required, or essential features or elements of any or all of the claims. The invention is defined solely by the appended claims including any amendments made during the pendency of this application and all equivalents of those claims.

I claim:

1. A latch circuit comprising:
   a D-type latch with a latch clock input, a data input and a corresponding data output, the D-type latch containing an SR latch and a single pole double throw switch, the single pole double throw switch forming a difference detector, the difference detector having a difference output at a node common to the latch clock input and that provides a difference signal when data at the data input is different than data at the corresponding data output; and
   a gate or edge triggered gate having a gate clock input to which a clock signal is supplied, an output coupled to the latch clock input and gate control input coupled to the difference output of the difference detector,
   wherein either:
   the latch circuit contains the gate and when the difference signal is provided to the gate control input the gate allows a clock signal supplied at the gate clock input to determine logic values supplied to the latch clock input, thereby resulting in the data at the data input being transferred to the data output, and wherein only after the data at the data input is transferred to the corresponding data output will the gate disallow the clock signal from determining the logic values supplied to the latch clock input or
   the latch circuit contains the edge triggered gate and only when both a transition of the clock signal supplied at the gate clock input is detected by the edge triggered gate and the difference signal is provided to the gate control input will the edge triggered, gate allow an edge of a clock signal supplied at the gate clock input to determine logic values supplied to the latch clock input, as a result, the data at the data input is transferred to the data output.

2. The latch circuit, as claimed in claim 1, wherein, the SR latch comprises cross coupled inverters.

3. The latch circuit, as claimed in claim 2, wherein each of the cross coupled inverters comprises a pair of series coupled complementary transistors, wherein each pair of series coupled complementary transistors has a common node that respectively provides the corresponding data output and a complementary data output corresponding to a complementary data input, and each common node is connected, through respective latch input transistors forming the single pole double throw switch, to the latch clock input.

4. The latch circuit, as claimed in claim 3, wherein one of the latch input transistors has a gate input coupled to the data input and another one of the latch input transistors has a gate input coupled to the complementary data input.

5. The latch circuit, as claimed in claim 1, wherein the difference detector is an exclusive OR circuit.

6. The latch circuit, as claimed in claim 1, wherein the difference detector is an exclusive NOR circuit.

7. The latch circuit, as claimed in claim 1, wherein the gate comprises a gate transistor selectively coupling the gate clock input to a control electrode of a clocking transistor that selectively couples the latch clock input to ground, and wherein the gate transistor has a control electrode coupled to the gate control input.

8. The latch circuit, as claimed in claim 7, wherein the gate further comprises a discharge transistor selectively coupling the control electrode of the clocking transistor to ground, the discharge transistor having a control electrode coupled to the gate control input.

9. The latch circuit, as claimed in claim 1, wherein only a single transistor is disposed between the latch clock input and ground.

10. The latch circuit, as claimed in claim 1, wherein the clock signal is the only clock signal used to determine the logic values supplied to the latch clock input.

11. The latch circuit, as claimed in claim 1, wherein the latch circuit does not use an inverter chain to generate a narrow clock pulse.

12. A latch circuit comprising:
    a D-type latch with a latch clock input, a data input and a corresponding data output;
    a difference detector coupled to the D-type latch, the difference detector having a difference output that provides a difference signal when data at the data input is different than data at the corresponding data output; and
    a gate or edge triggered gate having a gate clock input to which a clock signal is supplied, an output coupled to the latch clock input and gate control input coupled to the difference output of the difference detector, the gate containing a gate transistor directly connected to a clocking transistor, the gate transistor selectively coupling the gate clock input to a control electrode of the clocking transistor, the gate transistor having a control electrode coupled to the gate control input, the clocking transistor selectively coupling the latch clock input to ground,
    wherein:
    the latch circuit contains the gate and when the difference signal is provided to the gate control input the gate allows a clock signal supplied at the gate clock input to determine logic values supplied to the latch clock input, thereby resulting in the data at the data input being transferred to the data output, and wherein only after the data at the data input is transferred to the corresponding data output will the gate disallow the clock signal from determining the logic values supplied to the latch clock input.

13. The latch circuit, as claimed in claim 12, wherein the gate further comprises a discharge transistor selectively coupling the control electrode of the clocking transistor to ground, the discharge transistor having a control electrode coupled to the gate control input.

14. The latch circuit, as claimed in claim 13, wherein the discharge transistor is directly connected to the clocking transistor and to the gate transistor.

15. The latch circuit, as claimed in claim 13, wherein the gate consists of the gate transistor, the clocking transistor, and the discharge transistor.

16. The latch circuit, as claimed in claim 12, wherein the clocking transistor is directly connected to the latch clock input.

17. The latch circuit, as claimed in claim 12, wherein the latch circuit consists of the D-type latch, the difference detector and the gate.

18. The latch circuit, as claimed in claim 12, wherein the difference output and latch clock input are tied together.

* * * * *

UNITED STATES PATENT AND TRADEMARK OFFICE
CERTIFICATE OF CORRECTION

| | | |
|---|---|---|
| PATENT NO. | : 7,872,514 B2 | Page 1 of 1 |
| APPLICATION NO. | : 12/340659 | |
| DATED | : January 18, 2011 | |
| INVENTOR(S) | : Chee | |

It is certified that error appears in the above-identified patent and that said Letters Patent is hereby corrected as shown below:

In Column 9, Line 35, in Claim 1, delete "D-tvpe" and insert -- D-type --, therefor.

In Column 9, Line 36, in Claim 1, delete "switch." and insert -- switch, --, therefor.

In Column 9, Line 62, in Claim 1, delete "triggered," and insert -- triggered --, therefor.

Signed and Sealed this
Thirty-first Day of July, 2012

David J. Kappos
*Director of the United States Patent and Trademark Office*